United States Patent
Wilson et al.

(10) Patent No.: US 10,779,422 B2
(45) Date of Patent: Sep. 15, 2020

(54) SEALING ASSEMBLY FOR WASH-DOWN ELECTRICAL COMPONENT ENCLOSURES

(71) Applicant: Marlen International, Inc., Riverside, MO (US)

(72) Inventors: Douglas D. Wilson, Platte City, MO (US); Kyle D. Heaton, Shawnee, KS (US)

(73) Assignee: Marlen International, Inc., Riverside, MO (US)

( * ) Notice: Subject to any disclaimer, the term of this patent is extended or adjusted under 35 U.S.C. 154(b) by 192 days.

(21) Appl. No.: 16/116,794

(22) Filed: Aug. 29, 2018

(65) Prior Publication Data

US 2019/0090369 A1 Mar. 21, 2019

Related U.S. Application Data

(60) Provisional application No. 62/559,693, filed on Sep. 18, 2017.

(51) Int. Cl.
*E06B 7/086* (2006.01)
*H05K 5/02* (2006.01)
*H05K 5/00* (2006.01)
*H02B 1/28* (2006.01)
*H05K 5/06* (2006.01)

(52) U.S. Cl.
CPC ............. *H05K 5/0217* (2013.01); *H02B 1/28* (2013.01); *H05K 5/0017* (2013.01); *H05K 5/061* (2013.01)

(58) Field of Classification Search
CPC ... H02B 1/28; H02B 1/26; H02B 1/40; H05K 5/0217; H05K 5/061; H05K 5/0017; H05K 5/069; H05K 5/067; H05K 5/065; H05K 5/0221; H05K 5/0239; H05K 5/03; H05K 5/04; H05K 5/06
USPC .............................. 49/91.1, 73.1, 95, 96, 131
See application file for complete search history.

(56) References Cited

U.S. PATENT DOCUMENTS

| | | | | |
|---|---|---|---|---|
| 5,118,001 | A * | 6/1992 | Gambill | H02B 1/06 220/377 |
| 5,886,868 | A * | 3/1999 | White | H02B 1/066 361/652 |
| 5,914,460 | A * | 6/1999 | Mowery | H02B 1/28 174/17 CT |
| 6,140,580 | A * | 10/2000 | Weiss | H02B 1/28 174/562 |
| 6,512,669 | B1 * | 1/2003 | Goodwin | H02B 1/28 200/50.12 |
| 6,595,605 | B1 * | 7/2003 | Babcock | G06F 1/181 292/87 |

(Continued)

*Primary Examiner* — Chi Q Nguyen
(74) *Attorney, Agent, or Firm* — Hovey Williams LLP

(57) ABSTRACT

High-moisture integrity wash-down enclosures (10) for critical equipment includes housing wall structure (12) having a peripheral edge (16) defining a corresponding door opening (18); a shiftable door (20) having a peripheral margin (34) serves to cover the opening (18). The edge (16) and margin (34) cooperatively define a sealing zone (38) having therein a sealing assembly (40). The assembly (40) includes a primary outer seal (42), an innermost, generally U-shaped gutter (26), and a secondary inner seal (44). The outer seal (42) is disposed between the door (20) and wall structure (12), whereas the inner seal (44) is located between the gutter (26) and the (inner surface of the door (20).

20 Claims, 1 Drawing Sheet

(56) References Cited

U.S. PATENT DOCUMENTS

| | | | | |
|---|---|---|---|---|
| 7,851,703 | B2* | 12/2010 | Drane | H05K 5/061 |
| | | | | 174/50 |
| 9,560,784 | B1* | 1/2017 | Elbaz | H05K 5/061 |
| 2013/0118056 | A1* | 5/2013 | Covington | E05C 19/06 |
| | | | | 43/131 |
| 2013/0137358 | A1* | 5/2013 | Manahan | H02B 1/28 |
| | | | | 454/184 |
| 2015/0282363 | A1* | 10/2015 | Bier | H02B 1/38 |
| | | | | 174/50.52 |
| 2016/0261055 | A1* | 9/2016 | Tremaine | H05K 5/0004 |
| 2020/0068736 | A1* | 2/2020 | Kelly | H05K 5/0204 |

* cited by examiner

SEALING ASSEMBLY FOR WASH-DOWN ELECTRICAL COMPONENT ENCLOSURES

CROSS-REFERENCE TO RELATED APPLICATION

This application claims the benefit of provisional patent application Ser. No. 62/559,693 filed Sep. 18, 2017, which is incorporated herein by reference in its entirety.

BACKGROUND OF THE INVENTION

Field of the Invention

The present invention is broadly concerned with high moisture integrity wash-down enclosures for protecting critical equipment in high-moisture environments, such as electrical/electronic control components for food-processing apparatus. More particularly, the invention is concerned with such enclosures which have sealing assemblies about the entrance doors thereof which provide seals of greater moisture integrity than heretofore possible.

Description of the Prior Art

Present-day Federal and State regulations, particularly in the food and beverage industries, require that processing equipment be maintained in a clean and contaminate-free condition at all times. This in turn requires that the equipment be frequently washed down with water and/or cleansers, usually using high-pressure applicators. Successful wash-downs remove all waste materials and residues, in order to sanitize the equipment. However, these procedures mandate that electrical/electronic control components associated with the processing equipment be protected during wash-downs. Consequently, specialized enclosures must be provided having high degrees of water integrity, in order to prevent the control components from the hostile effects of moisture.

Attempts have been made in the past to provide enclosures of these types. Generally speaking, the enclosures provide resilient silicone or other synthetic resin seals around the peripheries of the enclosure access door(s). However, experience has proved that these types of sealing arrangements do not provide the necessary degree of moisture integrity. Indeed, without known exception, these prior enclosures will always leak, particularly after a large number of wash-downs. There is accordingly a need in the art for improved high-moisture integrity wash-down enclosures which are capable of protecting critical equipment over extended periods of use.

SUMMARY OF THE INVENTION

The present invention overcomes the problems outlined above and provides wash-down enclosures for high-moisture environments. Generally speaking, the enclosures include housing wall structure with at least one access door opening presenting a defining peripheral edge. Shiftable door(s) also form a part of the enclosures and for covering the door opening(s). In each case, the peripheral edge of the door opening, and the adjacent peripheral margin of the door, cooperatively defines a sealing zone. A sealing assembly is located within the zone and has a primary outer seal between and engaging the peripheral margin of the door and the housing wall structure, along with an inner, generally U-shaped gutter inboard of the outer seal. A secondary seal is also located between and engages the gutter and the door. The sealing zone and assembly extend about the entire periphery of the door and edge to give maximum moisture integrity.

In an embodiment, the gutter is integral with and forms a part of the peripheral edge of the enclosure, whereas the outer seal is carried by the door and has an innermost lip section between the door and the adjacent enclosure wall. The innermost gutter is generally U-shaped and supports the secondary seal.

DETAILED DESCRIPTION OF THE PREFERRED EMBODIMENT

Figure 1:
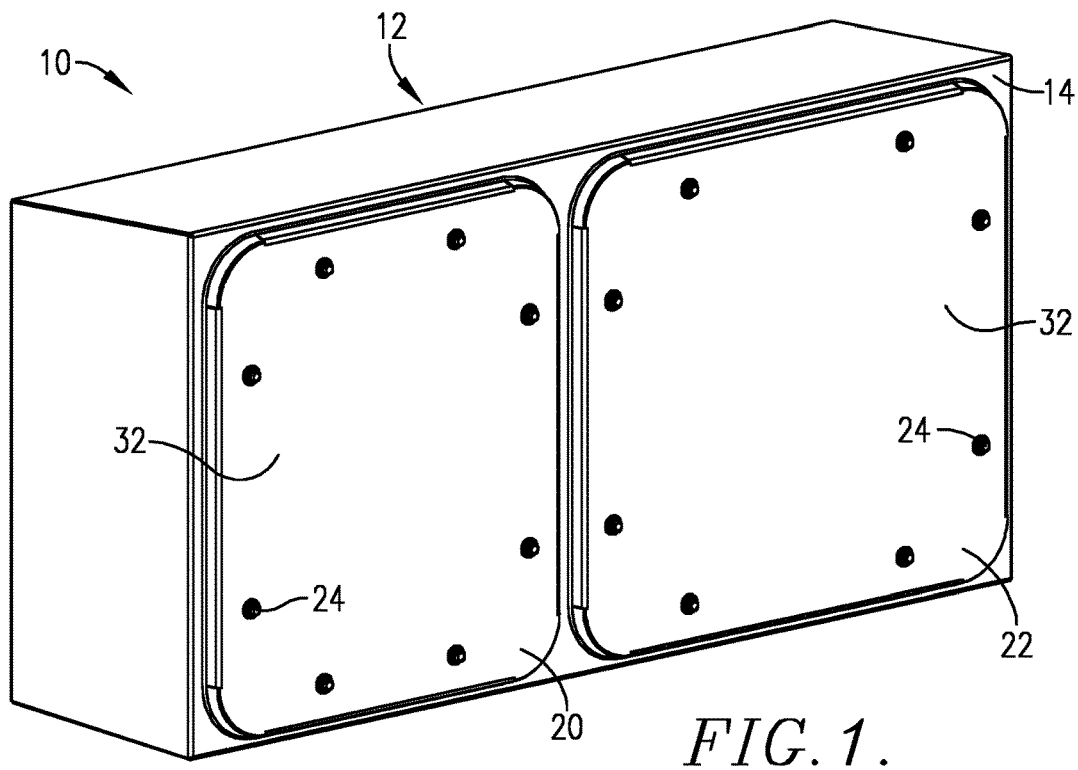
FIG. 1 is a perspective view of a wash-down enclosure for equipment such as electrical/electronic control components, shown with the double doors in the closed positions thereof.

Turning now to the drawing, FIG. 1 illustrates a moisture-impervious wash-down enclosure 10 designed to house any type of critical equipment, such as electrical/electronic components. The enclosure 10 is thus designed for use in high-moisture environments such as food processing plants which requires daily or more frequent wash-down of processing equipment. The illustrated enclosure is substantially rectangular, but the size and shape of the enclosure 10 may be varied, along with other constructional details thereof.

The enclosure 10 broadly has wall structure 12 including a front wall 14 presenting peripheral edges 16, which define a pair of door openings 18 permitting access to the interior of the enclosure 10. The enclosure also includes hingedly mounted doors 20 and 22, which, in the closed positions thereof, cover the door openings 18. Each of the doors 20, 22 has a series of latches 24 designed to engage the edges 16 in order to secure the doors in the closed positions thereof.

Figures 2, 3:
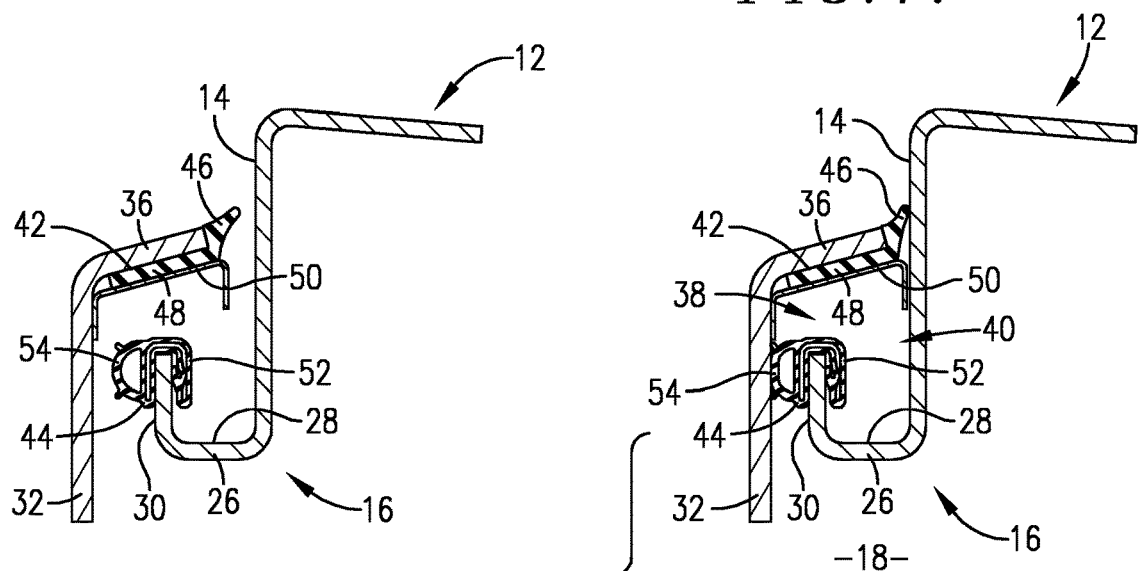
FIG. 2 is a fragmentary vertical sectional view illustrating the sealing assembly provided about the periphery of one of the closed doors, along the upper and lower margins thereof.
FIG. 3 is a fragmentary vertical sectional view illustrating one of the enclosure doors slightly open, and depicting the configuration of the sealing assembly in that condition.
Figure 4:
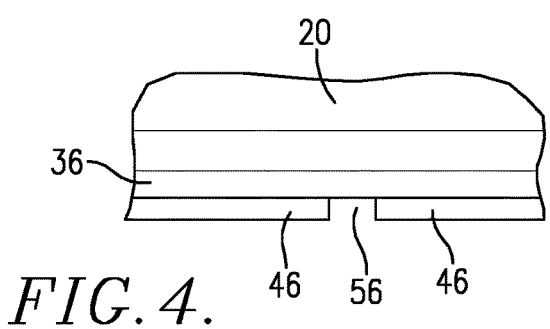
FIG. 4 is a fragmentary view illustrating a drainage opening in the primary lip seal of the sealing assembly, permitting drainage of moisture collected by the sealing assembly.

FIGS. 2-4 illustrate one of the doors 20 and the associated door opening 18. Although not shown, the door 22 is identical except for the size thereof. As depicted, the front wall 14 has an innermost, integral, generally U-shaped gutter 26 forming the edge 16, and which extends about the entire periphery of and defines the opening 18. The gutter 26 includes an inner wall segment 28 and an outwardly extending leg segment 30 spaced from wall 14. The door 20 has an outer panel 32 with a peripheral margin 34 in the form of a flange 36 extending towards front wall 14. When the door 20 is in the closed position illustrated in FIG. 2, the edge 16 and the margin 34 cooperatively define a sealing zone 38.

A sealing assembly 40 is situated within zone 38 and includes, in addition to the gutter 26, a primary outer seal 42 and a secondary inner seal 44. The outer seal 42 has a lip portion 46 and a generally planar connection portion 48 engaging the inner surface of flange 36. A somewhat U-shaped spring metal retainer 50 is secured to the inner surface of panel 32 by adhesive, spot-welding, or any other appropriate technique, and engages the inner surface of connection portion 48. The secondary inner seal 44 has a U-shaped connection portion 52 positioned over gutter leg 30, and an outwardly extending bubble seal portion 54 between the leg segment 30 and door panel 32.

When the door 20 is closed, the lip portion 46 is compressed, sealingly engages the wall 14 outboard of the gutter 26, and provides the primary means of preventing entrance of moisture into the enclosure 10. In this condition of the door 20, the secondary inner seal 44 also comes into play by providing both the moisture-collecting gutter 26 and the secondary seal afforded by compression of the bubble seal portion 54 against the door panel 32. It has been found that this combination of seals provides a very high degree of water integrity for the enclosure 10. In the event that small amounts of moisture are collected within the gutter 26, a small drainage opening 56 is provided at the center of the lip portion 46 and retainer 50 at approximately the center bottom of the door 20 (FIG. 4).

Those skilled in the art will appreciate that the primary and secondary seals 42, 44 can be fabricated from a variety of different materials, so long as the materials perform as required. In an embodiment, the primary outer seal 42 is fabricated from FDA blue silicone having a durometer of 50. This material is a known FDA-grade silicone gasket material and is intended for repeated use with foods. This material has a service temperature of from −80 to +450° F., takes a low-compression set, and has excellent UV and ozone resistance. This silicone material is non-toxic and chemically inert. Other properties include a tensile strength of 700 psi, a specific gravity of 1.45 g/cc, a tear resistance of 40 ppi (DieB), and an elongation of 300%. More generally, the material of seal 42 advantageously has a durometer value of from about 40-90.

The secondary inner seal 44 is made from ethylene propylene diene monomer M (EPDM) rubber. This EPDM material typically has a Shore A hardness of 40-90, an ultimate tensile failure stress of 25 MPa, an elongation after fracture of greater than 300%, a coefficient of lineal thermal expansion of 160 μm/m·K, and a service temperature range of from about −50 to +150° C. The specific seal 44 is a commercially available product formed of EPDM and having a Shore A hardness of 60±5, and has a U-shaped spring metal insert encased within the connection portion 52 thereof. This available product is sold under the designation 1101-09-FR01 by EMKA Beschlagteile GmbH & Co. KG, Velbert, Germany. More broadly, the material of seal 44 should have a Shore A hardness range of 40-90 and a tensile strength of 6-13 psi.

We claim:

1. A wash-down enclosure comprising:
wall structure defining at least one door opening presenting a peripheral edge;
a door shiftable between an open position and a closed position, said door operable in the closed position thereof to cover said door opening and having a peripheral margin, there being a sealing zone cooperatively defined by said peripheral edge and the adjacent peripheral margin of said door; and
a sealing assembly within said sealing zone, including:
a primary outer seal between and engaging the peripheral margin of said door and the peripheral edge of said wall structure;
an inner, generally U-shaped gutter inboard of said primary outer seal; and
a secondary seal between and engaging said gutter and said door, said primary and secondary seals being physically separate, said gutter oriented to collect moisture.

2. The enclosure of claim 1, said sealing zone and sealing assembly extending about the entire periphery of said door and said edge.

3. The enclosure of claim 1, said gutter being integral with and forming a part of said peripheral edge.

4. The enclosure of claim 1, said primary outer seal being carried by said door.

5. The enclosure of claim 4, said primary outer seal including an innermost lip section engaging said edge and a connection portion engaging said door.

6. The enclosure of claim 5, including a spring metal retainer engaging said connection portion to maintain the primary outer seal in place.

7. The enclosure of claim 1, said gutter including an outer leg section, said secondary seal secured to said leg section.

8. The enclosure of claim 7, said secondary seal including a generally U-shaped connection portion and an outwardly extending sealing portion, said U-shaped connection portion secured to said outer leg section.

9. A wash-down enclosure comprising:
wall structure defining at least one door opening presenting a peripheral edge;
a door shiftable between an open position and a closed position, said door operable in the closed position thereof to cover said door opening and having a peripheral margin, there being a sealing zone cooperatively defined by said peripheral edge and the adjacent peripheral margin of said door; and
a sealing assembly within said sealing zone, including:
a primary outer seal carried by said door, said primary outer seal located between and engaging the peripheral margin of said door and the peripheral edge of said wall structure;
an inner, generally U-shaped gutter inboard of said primary outer seal; and
a secondary seal between and engaging said gutter and said door,
said primary outer seal including an innermost lip section engaging said edge and a connection portion engaging said door.

10. The enclosure of claim 9, said primary and secondary seals being physically separate, said gutter oriented to collect moisture.

11. The enclosure of claim 9, said gutter being integral with and forming a part of said peripheral edge.

12. The enclosure of claim 9, said gutter including an outer leg section, said secondary seal secured to said leg section.

13. The enclosure of claim 12, said secondary seal including a generally U-shaped connection portion and an outwardly extending sealing portion, said U-shaped connection portion secured to said outer leg section.

14. A wash-down enclosure comprising:
wall structure defining at least one door opening presenting a peripheral edge;
a door shiftable between an open position and a closed position, said door operable in the closed position thereof to cover said door opening and having a peripheral margin, there being a sealing zone cooperatively defined by said peripheral edge and the adjacent peripheral margin of said door; and a sealing assembly within said sealing zone, including:
- a primary outer seal between and engaging the peripheral margin of said door and the peripheral edge of said wall structure;
- an inner, generally U-shaped gutter inboard of said primary outer seal; and
- a secondary seal between and engaging said gutter and said door, said gutter including an outer leg section, said secondary seal secured to said leg section, said secondary seal including a generally U-shaped connection portion and an outwardly extending sealing portion, said U-shaped connection portion secured to said outer leg section.

15. The enclosure of claim 14, said gutter being integral with and forming a part of said peripheral edge.

16. The enclosure of claim 14, said primary outer seal being carried by said door.

17. The enclosure of claim 16, said primary outer seal including an innermost lip section engaging said edge and a connection portion engaging said door.

18. The enclosure of claim 17, including a spring metal retainer engaging said connection portion to maintain the primary outer seal in place.

19. A wash-down enclosure comprising:
- wall structure defining at least one door opening presenting a peripheral edge;
- a door shiftable between an open position and a closed position, said door operable in the closed position thereof to cover said door opening and having a peripheral margin, there being a sealing zone cooperatively defined by said peripheral edge and the adjacent peripheral margin of said door; and
- a sealing assembly within said sealing zone, including:
  - a primary outer seal carried by said door, said primary outer seal located between and engaging the peripheral margin of said door and the peripheral edge of said wall structure;
  - a spring metal retainer engaging said primary outer seal to maintain the primary outer seal in place;
  - an inner, generally U-shaped gutter inboard of said primary outer seal; and
  - a secondary seal between and engaging said gutter and said door.

20. The enclosure of claim 19, said primary and secondary seals being physically separate, said gutter oriented to collect moisture.

* * * * *